United States Patent
Heo et al.

(10) Patent No.: US 6,717,448 B2
(45) Date of Patent: Apr. 6, 2004

(54) DATA OUTPUT METHOD AND DATA OUTPUT CIRCUIT FOR APPLYING REDUCED PRECHARGE LEVEL

(75) Inventors: Nak-won Heo, Suwon (KR); Bai-sun Kong, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/212,166

(22) Filed: Aug. 6, 2002

(65) Prior Publication Data
US 2003/0094985 A1 May 22, 2003

(30) Foreign Application Priority Data
Nov. 21, 2001 (KR) .................................. 2001-72590

(51) Int. Cl.[7] .............................................. H03K 3/289
(52) U.S. Cl. ........................ 327/202; 237/203; 237/208
(58) Field of Search .......................... 327/51–57, 202, 327/203, 208–214; 365/203

(56) References Cited

U.S. PATENT DOCUMENTS 5,973,518 A * 10/1999 Vallancourt .................. 327/94
6,268,761 B1 * 7/2001 Naganawa .................. 327/536
6,366,130 B1 * 4/2002 Podlesny et al. ............. 327/55
6,519,196 B1 * 2/2003 Jang et al. .................. 365/205

* cited by examiner

Primary Examiner—Tuan T. Lam
Assistant Examiner—Hiep Nguyen
(74) Attorney, Agent, or Firm—Volentine Francos, PLLC

(57) ABSTRACT

A data output method and data output circuit capable of increasing data output speed by reducing clock power while increasing sensing speed are provided. The data output method includes (a) precharging output terminals to a precharge voltage lower than a supply voltage; and (b) outputting differential output signals to the output terminals in response to differential input signals. In step (a) the output terminals are precharged in response to a clock signal having a first state, and in step (b) the differential signals are output to the output terminals in response to the clock signal having a second state. The voltage swing of the clock signal is set lower than the precharge voltage. The method further includes latching the differential output signals.

7 Claims, 5 Drawing Sheets

| PARAMETER | SAFF $C_L=200f$ | RCSFF $C_L=200f$ | RPLFF $C_L=200f$ |
|---|---|---|---|
| RISING DELAY, Clk–Q | 232ps | 390ps | 336ps |
| FALLING DELAY, Clk–Q | 223ps | 552ps | 321ps |
| SETUP TIME | −13ps | −112ps | −71ps |
| HOLD TIME | 41ps | 122ps | 103ps |
| AVERAGE POWER | 108 μW | 101 μW | 92 μW |

DATA OUTPUT METHOD AND DATA OUTPUT CIRCUIT FOR APPLYING REDUCED PRECHARGE LEVEL

CROSS-REFERENCES TO RELATED APPLICATIONS

This application claims priority under 35 U.S.C. §119 from Korean Patent Application No. 2001-72590, filed on Nov. 21, 2001, the entirety of which is hereby incorporated by reference as if fully set forth herein.

BACKGROUND

1. Field of the Invention

The present invention relates to a data output method and data output circuit, and more particularly, to a data output method and data output circuit capable of increasing data output speed by reducing clock power while increasing sensing speed.

2. Description of the Related Art

FIG. 1 is a circuit diagram of a sense amplifier employing a flip-flop. Referring to FIG. 1, a Sense Amplifier Based Flip-Flop (SAFF) 100 comprises a master latch 10 and a slave latch 30. The master latch 10 comprises a cross coupled sense amplifier and the slave latch 30 comprises an R-S latch.

The SAFF 100 receives differential input signals (D and /D) and outputs differential output signals (Q and /Q). When a clock signal (CLK) is at a "low" logic level, the SAFF 100 is precharged, and when the clock signal (CLK) is at a "high" logic level, the SAFF 100 senses data (D and /D) and outputs data at a CMOS level.

Generally, the SAFF 100 consumes clock power (Pcp) and dynamic power (Pdp). The clock power and the dynamic power are expressed by the following equations 1 and 2, respectively:

$$Pcp = Cc \times Vc^2 \times fc \quad (1)$$

Here, Cc denotes the loading of the clock signal (CLK), Vc denotes the amplitude of the clock signal (CLK), and fc denotes the frequency of the clock signal (CLK).

$$Pdp = Ctc \times V^2 \times f \quad (2)$$

Here, Ctc denotes the total capacitance of internal nodes (/R, /S) in transition, V denotes the width of voltage swing of the internal nodes, and f denotes the transition frequency.

It is desired to reduce the clock power (Pcp). However, the clock power (Pcp) of the system increases as the clock loading increases. Therefore, it is a problem that the clock power (Pcp) of the SAFF 100 cannot be reduced.

FIG. 2 is a circuit diagram of a reduced clock swing flip-flop. The Reduced Clock Swing Flip-Flop (RCSFF) 200 of FIG. 2 uses a clock voltage lower than a supply voltage (VDD) in order to reduce the clock power (Pcp). The clock voltage means the amplitude of the clock signal (CLK). Referring to FIG. 2, the RCSFF 200 comprises a master latch 210 and a slave latch 230. While the RCSFF 200 is precharged, nodes (P and /P) are precharged to the supply voltage (VDD), and the gate voltages of precharge transistors (P1 and P2) are lower than the supply voltage (VDD). As a result, the leakage current of the precharge transistors (P1 and P2) increases. Therefore, in order to reduce the leakage current, the threshold voltage of the precharge transistors must be increased.

To increase the threshold voltage, a bulk voltage (Vwell) higher than the supply voltage (VDD) should be provided to the bulk of precharge transistors (P1 and P2).

SUMMARY

To solve the above problems, it is an objective of the present invention to provide a data output method and data output circuit capable of increasing data output speed by reducing clock power while increasing sensing speed.

Accordingly, to accomplish the objective of the present invention, there is provided a data output method including (a) precharging output terminals to a precharge voltage lower than a supply voltage; and (b) outputting differential output signals to the output terminals in response to differential input signals.

It is preferable that in step (a) the output terminals are precharged in response to a clock signal of a first state, and in step (b) the differential signals are output to the output terminals in response to a clock signal of a second state.

Beneficially, the voltage or swing width of the clock signal is set lower than the precharge voltage.

Beneficially, the method further includes latching the differential output signals.

Also, there is provided a data output method including: (a) precharging output terminals to a first voltage lower than a supply voltage, in response to a clock signal of a first state; and (b) converting received first differential output signals into second differential output signals, in response to a clock signal of a second state, and outputting the converted signals to the output terminals.

Beneficially, the method further includes providing the clock signal at a second voltage lower than the first voltage.

Further, there is provided a data output method, including precharging output terminals to a precharge voltage lower than a supply voltage, in a precharge phase; and outputting differential output signals to the output terminals in response to differential input signals, in an evaluation phase.

Still further, there is provided a data output circuit which outputs a differential output signal to output terminals, includes a precharge circuit that precharges the output terminals to a precharge voltage lower than a supply voltage; and an output circuit that outputs the differential output signals to the output terminals in response to differential input signals.

Beneficially, the precharge circuit precharges the output terminals in response to a clock signal of a first state, and the output circuit outputs the differential output signals to the output terminals in response to a clock signal of a second state.

Beneficially, the voltage of the clock signal is lower than the precharge voltage.

Beneficially, the circuit further includes a latch circuit that latches the differential output signals.

Yet further, there is provided a data output circuit that outputs a differential output signal to output terminals, includes a precharge circuit which precharges the output terminals to a precharge voltage lower than a supply voltage, in response to a clock signal of a first state; and an output circuit that outputs the differential output signals to the output terminals, in response to the clock signal of a second state.

Beneficially, the voltage of the clock signal is lower than the precharge voltage.

Beneficially, the circuit further includes a latch circuit which latches the differential output signals.

Moreover, there is provided a data output circuit with a flip-flop having a master latch and a slave latch, in which the master latch has a precharge circuit that precharges output terminals to a precharge voltage lower than a supply voltage; and an output circuit that outputs differential output signals to the output terminals in response to differential input signals.

Beneficially, the precharge circuit precharges the output terminals in response to a clock signal of a first state, and the output circuit outputs the differential output signals to the output terminals in response to a clock signal of a second state.

Beneficially, the voltage of the clock signal is lower than the precharge voltage.

Beneficially, the precharge circuit includes a precharge/equalizer circuit that, in response to a clock signal of a first state, precharges the output terminals to the precharge voltage and equalizes the output terminals; and the output circuit includes a differential pair that, in response to the clock signal of a second state, receives differential input signals and outputs first output signals corresponding to the differential input signals, and a CMOS logic circuit that outputs the differential output signals in response to the first output signals.

BRIEF DESCRIPTION OF THE DRAWINGS

The above objects and advantages of the present invention will become more apparent by describing in detail preferred embodiments thereof with reference to the attached drawings in which.

DETAILED DESCRIPTION

Figure 1:
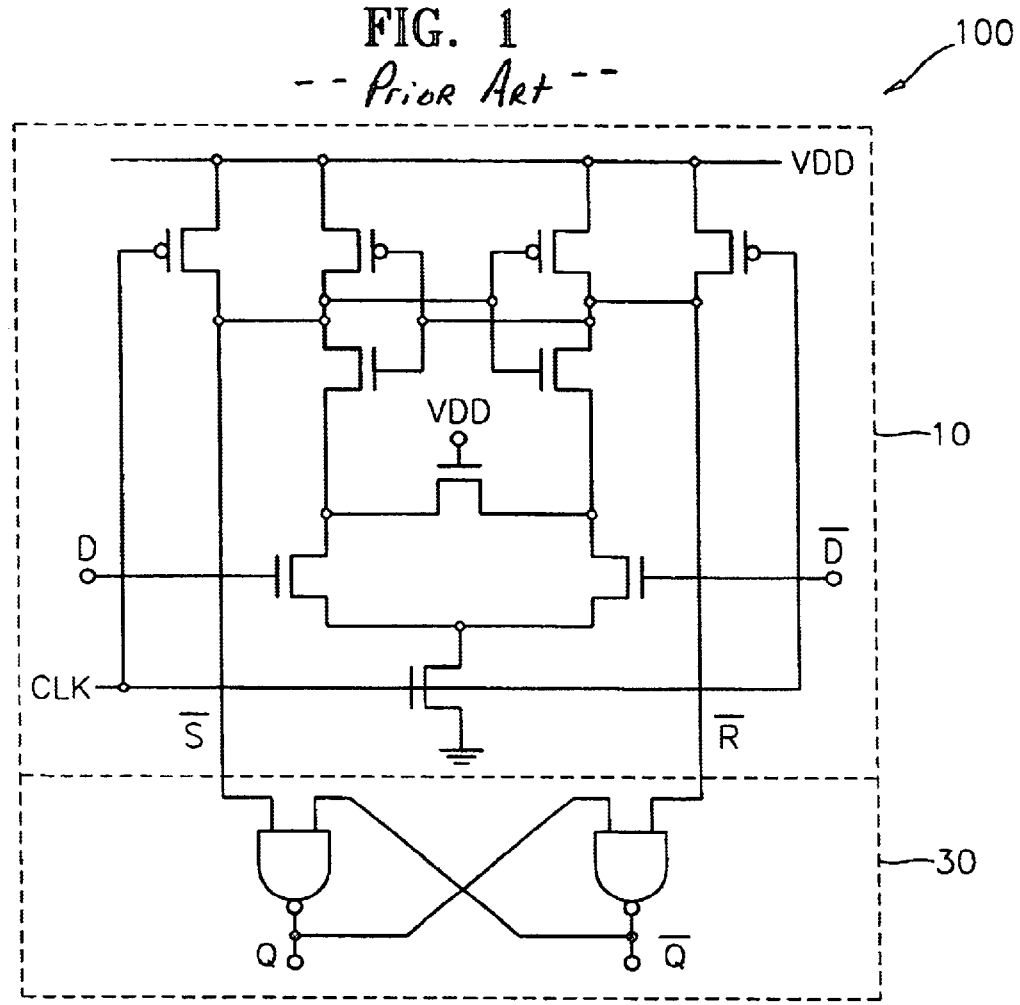
FIG. 1 is a circuit diagram of a sense amplifier employing a flip-flop.
Figure 2:
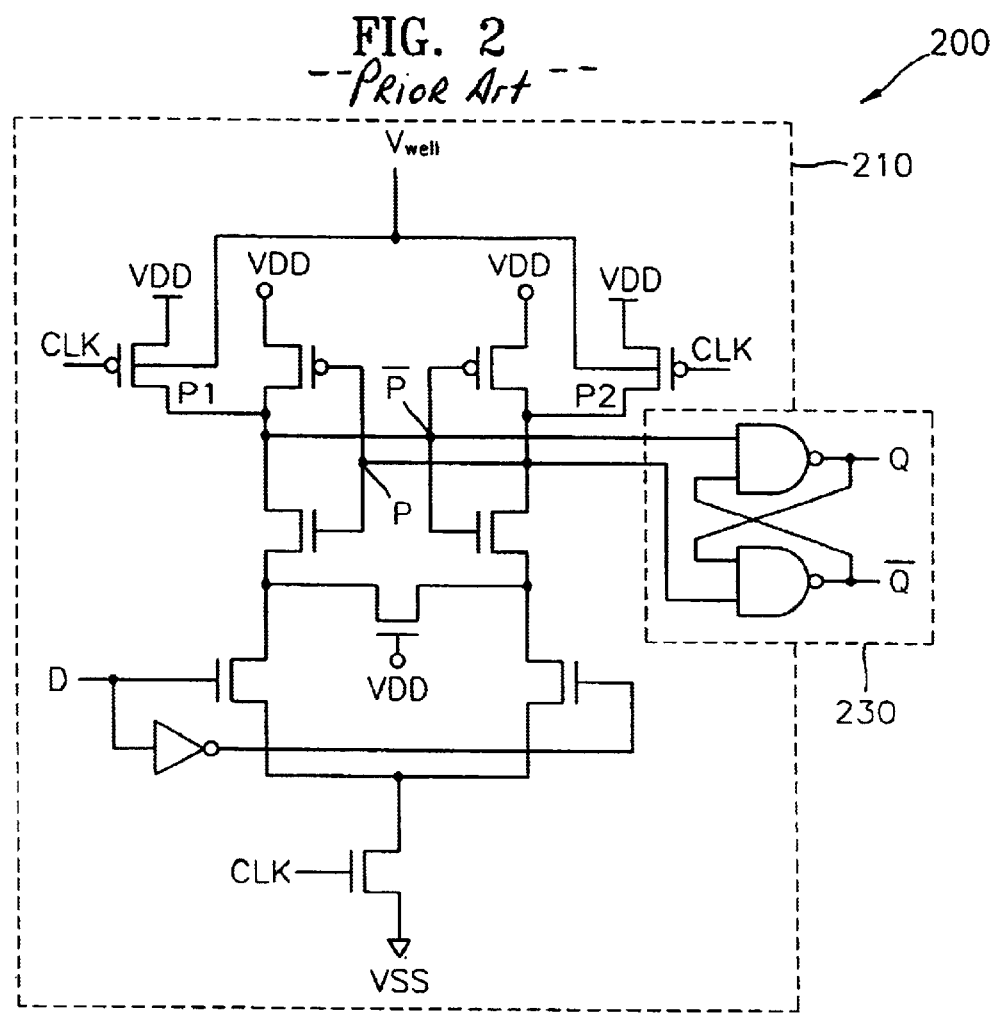
FIG. 2 is a circuit diagram of a reduced clock swing flip-flop.
Figure 3:
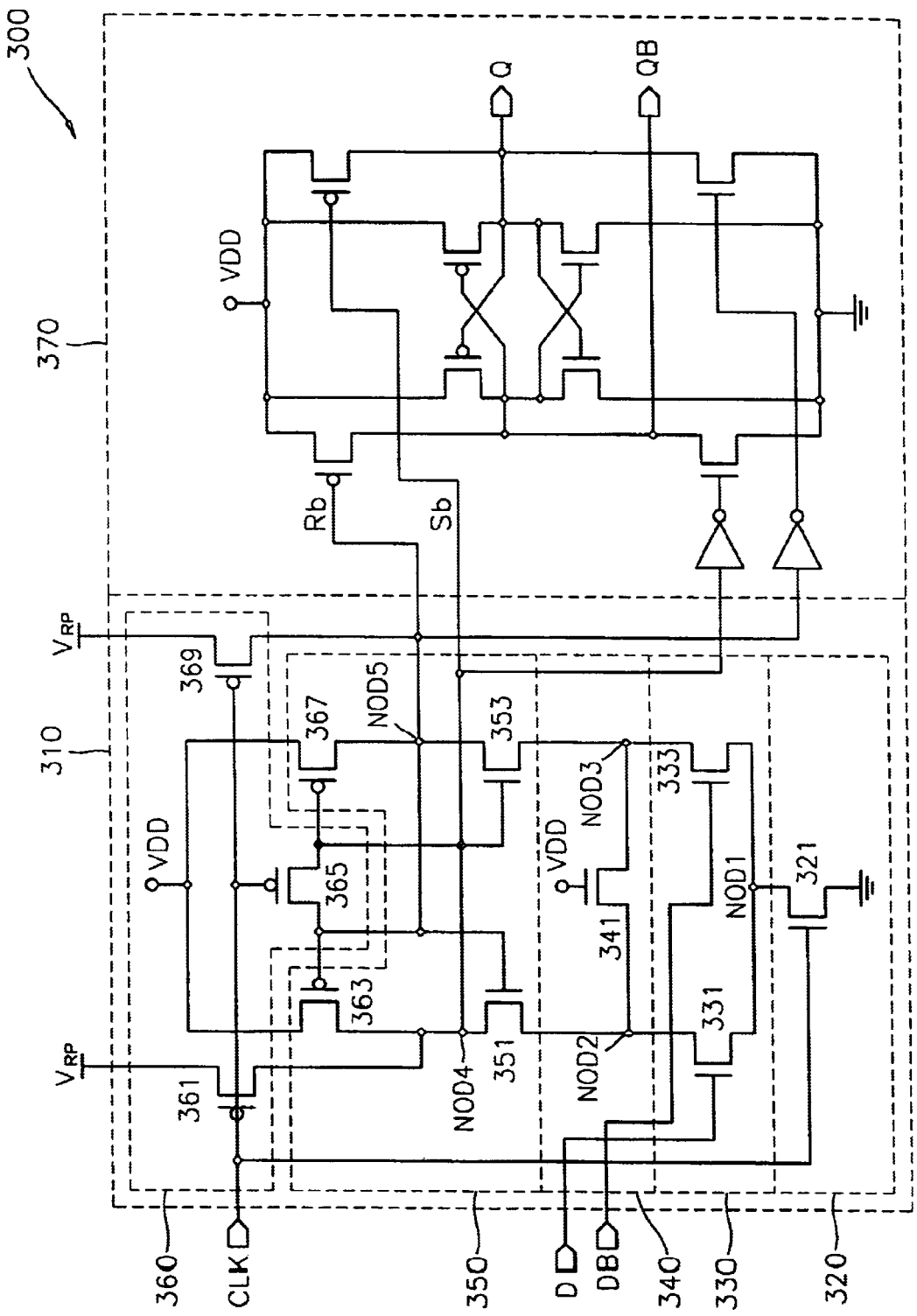
FIG. 3 is a circuit diagram of a reduced precharge level flip-flop according to one or more aspects of the present invention.

FIG. 3 is a circuit diagram of a first embodiment of a reduced precharge level flip-flop. Referring to FIG. 3, the Reduced Precharge Level Flip-Flop (RPLFF) 300 comprises a master latch 310 and a slave latch 370.

The master latch 310 precharges nodes (NOD4 and NOD5) with a precharge voltage ($V_{RP}$) lower than a supply voltage (VDD) in response to a first state (for example, "low") of a clock signal (CLK), and converts differential input signals (D and DB) into differential output signals (Sb and Rb) and outputs the converted signals, in response to a second state (for example, "high") of the clock signal (CLK). It is preferable that the differential output signals (Sb and Rb) have CMOS levels.

Beneficially, the precharge voltage ($V_{RP}$) is set lower than the supply voltage (VDD), and the voltage of the clock signal (CLK) is set lower than the precharge voltage ($V_{RP}$). The slave latch 370 senses and latches the first state of the differential signals (Sb and Rb).

Hereinafter, a precharge phase is defined as a phase in which nodes (NOD4) and (NOD5) are precharged to the precharge voltage ($V_{RP}$), in response to the clock signal (CLK) of the first state, and an evaluation phase is defined as a phase in which the differential signals (D and DB) are received and signals (Sb and Rb) having a CMOS level are output, in response to the clock signal (CLK) of the second state.

The master latch 310 precharges the nodes (NOD4) and (NOD5) to the precharge voltage ($V_{RP}$) in the precharge phase. The precharge voltage ($V_{RP}$) and the voltage ($V_{CLK}$) of the clock signal (CLK) are expressed as the following equations 3 and 4, respectively:

$$V_{RP}=VDD-\alpha, (\alpha<Vtp) \quad (3)$$

$$V_{CLK}=V_{RP}-\beta, (\beta<Vth) \quad (4)$$

Here, VDD denotes the supply voltage of the semiconductor device, Vtp denotes the absolute value of the threshold voltage of PMOS transistors 361 and 369 for preventing leakage current in PMOS transistors 361 and 369 during precharge, and Vth denotes the absolute value of the threshold voltage of the MOS transistor.

The master latch 310 comprises a pull-down circuit 320, a differential pair 330, a switching circuit 340, a sense amplification circuit 350, and a precharge/equalizer circuit 360. The pull-down circuit 320 has an NMOS transistor 321 which is connected between a node (NOD1) and a ground voltage, and is turned on in response to the clock signal (CLK) of the second state.

The differential pair 330 has NMOS transistors 331 and 333. The NMOS transistor 331 is connected between nodes (NOD1) and (NOD2) and the first data (D) is input to the gate of the NMOS transistor 331. The NMOS transistor 333 is connected between nodes (NOD1) and (NOD3) and the second data (DB) is input to the gate of the NMOS transistor 333.

Preferably, the first data (D) and the second data (DB) are differential signals or complementary signals. The differential pair 330 outputs differential signals to the nodes (NOD2 and NOD3) in response to the first data (D) and the second data (DB).

The switching circuit 340 comprises NMOS transistor 341, which is connected between the nodes (NOD2) and (NOD3). The supply voltage (VDD) is input to the gate of the NMOS transistor 341. The switching circuit 340 prevents the nodes (NOD2) or (NOD3) from floating in response to the supply voltage (VDD).

Referring to FIG. 3, the sense amplification circuit 350 comprises cross coupled PMOS transistors 363 and 367 and cross coupled NMOS transistors 351 and 353, and senses signals of the nodes (NOD2) and (NOD3) to output a CMOS level signal.

The precharge/equalizer circuit 360 comprises a plurality of PMOS transistors 361, 365 and 369. The transistor 361 is connected between the precharge voltage ($V_{RP}$) and the node (NOD4), and the transistor 369 is connected between the precharge voltage ($V_{RP}$) and the node (NOD5). That is, the transistors 361 and 369 precharge the nodes (NOD4) and (NOD5) to the precharge voltage ($V_{RP}$) level in response to the clock signal (CLK) of the first state. The transistor 365 equalizes the nodes (NOD4) and (NOD5).

The clock signal (CLK) is input to the gates of the transistors 361, 365, and 369. The transistor 363 is connected between the supply power (VDD) and the node (NOD4), the transistor 367 is connected between the supply power (VDD) and the node (NOD5), and the transistor 365 is connected between the node (NOD4) and the node (NOD5). The output voltage (Sb) of the node (NOD4) and the output voltage (Rb) of the node (NOD5) are input to the slave latch 370.

The slave latch 370 comprises a plurality of inverters and transistors, and outputs the first output signal (Q) and the second output signal (QB) in response to the output voltage (Sb) of the node (NOD4) and the output voltage (Rb) of the node (NOD5). When the output voltage (Sb) of the node (NOD4) is a "low" logic level, the slave latch 370 outputs the first output signal (Q) at a "high" logic level, and when the output voltage (Rb) of the node (NOD5) is a "low" logic level, outputs the first output signal (Q) at a "low" logic level. The first output signal (Q) and the second output signal (QB) are complementary to each other.

Figure 4:
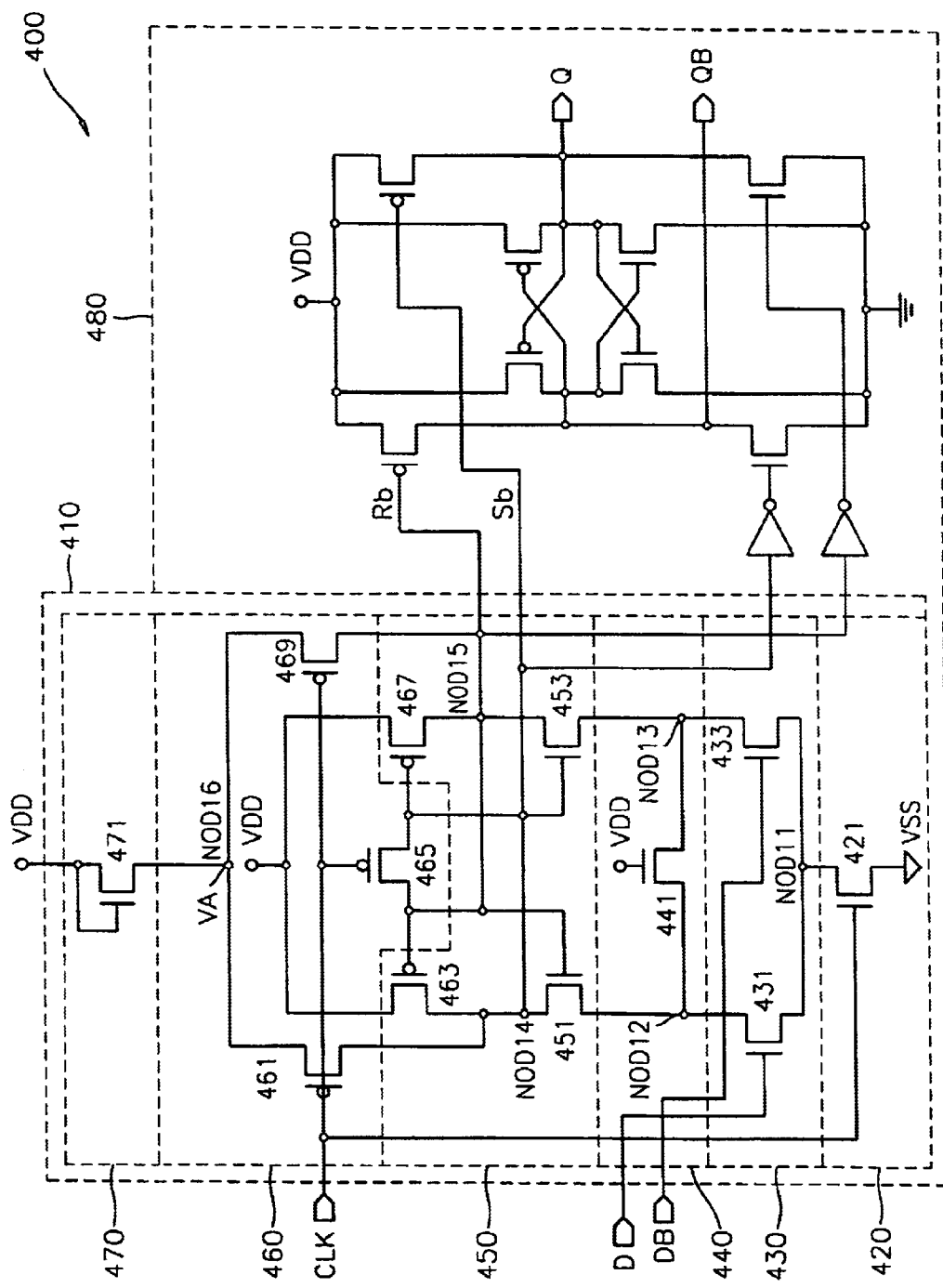
FIG. 4 is a circuit diagram of another reduced precharge level flip-flop according to one or more aspects of the present invention.

FIG. 4 is a circuit diagram of a second embodiment of a reduced precharge level flip-flop. The RPLFF 400 of FIG. 4 comprises a master latch 410 and a slave latch 480.

The master latch 410 precharges nodes (NOD14) and (NOD15) to a precharge voltage (VA) lower than the supply voltage (VDD), in response to the clock signal (CLK) of the first state, and converts differential input signals (D and DB) into differential output signals (Sb and Rb) and outputs the converted signals, in response to the clock signal (CLK) of the second state. Preferably, the differential output signals (Sb and Rb) have CMOS levels.

Beneficially, the precharge voltage (VA) is set lower than the supply voltage (VDD), and the voltage of the clock signal (CLK) is set lower than the precharge voltage (VA). The slave latch 480 latches differential output signals (Sb and Rb).

The master latch 410 precharges the nodes (NOD14) and (NOD15) to the precharge voltage (VA) in the precharge phase. The precharge voltage (VA) and the voltage ($V_{CLK}$) of the clock (CLK) are expressed as the following equations 5 and 6, respectively:

$$VA=VDD-\gamma, (\gamma<Vtp) \quad (5)$$

$$V_{CLK}=VA-\beta, (\beta<Vth) \quad (6)$$

Here, VDD denotes the supply voltage of the semiconductor device, Vtp denotes the threshold voltage of a transistor 471, and Vth denotes the absolute value of the threshold voltage of a MOS transistor.

The master latch 410 comprises a pull-down circuit 420, a differential pair 430, a switching circuit 440, a CMOS logic circuit 450, a precharge/equalizer circuit 460, and a clamping circuit 470. The pull-down circuit 420 comprises an NMOS transistor 421, which is connected between a node (NOD11) and a ground voltage (VSS). The clock signal (CLK) is input to the gate of the NMOS transistor 421.

The differential pair 430 comprises NMOS transistors 431 and 433. The transistor 431 is connected between the node (NOD11) and a node (NOD12), and the first data (D) is input to the gate of the transistor 431. The transistor 433 is connected between the node (NOD11) and a node (NOD13), and the second data (DB) is input to the gate of the transistor 433.

Preferably, the first data (D) and the second data (DB) are differential signals or complementary signals to each other. That is, the differential pair 430 outputs differential signals to respective nodes (NOD12) and (NOD13), in response to the first data (D) and the second data (DB).

The switching circuit 440 comprises an NMOS transistor 441, which is connected between the node (NOD12) and the node (NOD13). The supply voltage (VDD) is input to the gate of the transistor 441. The switching circuit 440 prevents the node (NOD12) and/or the node (NOD13) from floating, in response to the supply voltage (VDD).

Referring to FIG. 4, the sense amplification circuit 450 comprises cross coupled PMOS transistors 463 and 467, and cross coupled NMOS transistors 451 and 453, and outputs CMOS level signals in response to the output signals of the differential pair 440. The clamping circuit 470 comprises a diode connected NMOS transistor 471 that is connected between the supply voltage (VDD) and a node (NOD16), and clamps the supply voltage (VDD). Since the clamping circuit 470 provides a voltage lower than the supply voltage (VDD) to the node (NOD16), the clamping circuit 470 can be replaced by a predetermined diode.

The precharge/equalizer circuit 460 comprises a plurality of PMOS transistors 461, 465, and 469. The transistor 461 is connected between the node (NOD16) and the node (NOD14), and the transistor 469 is connected between the node (NOD16) and the node (NOD15). In this case, the precharge voltage (VA) is equal to the voltage of the node (NOD16). That is, the transistors 461 and 469 precharge the nodes (NOD14 and NOD15) to the precharge voltage (VA) in response to the clock signal (CLK) of the first state.

The clock signal (CLK) is input to the gates of the transistors 461, 465, and 469. The transistor 463 is connected between the supply power (VDD) and the node (NOD14), the transistor 467 is connected between the supply power (VDD) and the node (NOD15), and the transistor 465 is connected between the node (NOD14) and the node (NOD15). The output voltage (Sb) of the node (NOD14) and the output voltage (Rb) of the node (NOD15) are input to the slave latch 480.

The slave latch 480 comprises a plurality of inverters and transistors, and outputs the first output signal (Q) and the second output signal (QB) in response to the output voltage (Sb) of the node (NOD14) and the output voltage (Rb) of the node (NOD15). When the output voltage (Sb) of the node (NOD14) is a "low" logic level, the slave latch 480 outputs the first output signal (Q) at a "high" logic level, and when the output voltage (Rb) of the node (NOD15) is a "low" logic level, outputs the first output signal (Q) at a "low" logic level.

Figures 5, 6:
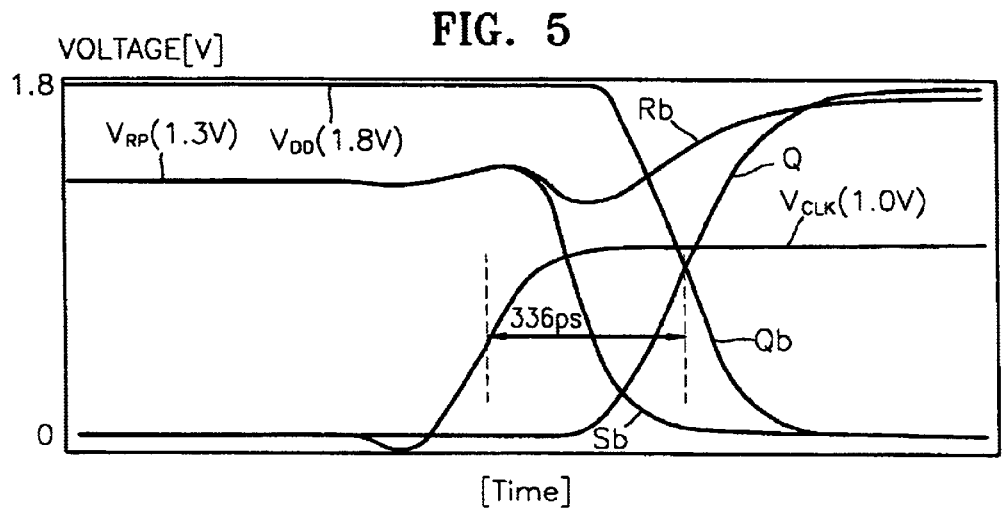
FIG. 5 is a simulation diagram of input/output waveforms according to the embodiment of FIG. 3.
FIG. 6 is a table showing the simulation result of SAFF and RCSFF of the prior art technology, and RPLFF parameters according to an embodiment of the present invention.

FIG. 5 is a simulation diagram of input/output waveforms. FIG. 5 shows the result of a simulation in which the supply voltage (VDD) is 1.8V, the precharge voltage ($V_{RP}$) is 1.3V, the clock voltage (Vclk) is 1.0V, |Vth| is 0.65V, and the threshold voltage (Vtn) of the NMOS transistors 351 and 353 is 0.5V. Referring to FIGS. 3 and 5, the operation of the RPLFF 300 will now be explained.

First, when the clock signal (CLK) is in the first state (for example, 0V), that is, in the precharge phase, the transistors 361, 365, and 369 are turned on, and therefore the nodes (NOD4) and (NOD5) are precharged to the precharge voltage ($V_{RP}$) (for example, 1.3V). Also, since the transistor 341 is turned on in response to the supply voltage (VDD), the nodes (NOD2) and (NOD3) reach a voltage ($V_{RP}$–Vtn) equal to the difference between the precharge voltage ($V_{RP}$) and the threshold voltage (Vtn) of the NMOS transistors 351 and 353. However, since the transistor 321 is turned off, the differential pair 330 does not operate.

Next, when the clock signal (CLK) is in a second state (for example, 1.0V), that is, in an evaluation phase, transistors 361, 365, and 369 are turned off, but nodes (NOD4 and NOD5) maintain the precharge voltage ($V_{RP}$) (for example, 1.3V). When the first data (D) is a "high" logic level and the second data (DB) is a "low" logic level, the voltage of the node (NOD2) becomes a little lower than the voltage of the node (NOD3). If the sensing operation by the sense amplification circuit 350 is completed, the node (NOD2) is changed to a "low" logic level by a current path formed by the transistor 331, and the node (NOD3) is changed to a "low" logic level by a current path formed by the transistors 331 and 341.

Preferably, the differential pair 330 receives the differential signals (D and DB) and outputs the differential signals. That is, since the sense amplification circuit 350 senses the voltages of the node (NOD2) and the node (NOD3), if the voltage of the node (NOD2) is a little lower than the voltage of the node (NOD3), the transistor 351 is turned on and the output voltage (Sb) of the node (NOD4) changes to a "low" logic level, but the transistor 353 is turned off and the output voltage (Rb) of the node (NOD5) maintains a "high" logic level.

The sense amplification circuit 350 outputs the signals (Sb, Rb) at CMOS levels to the slave latch 370, in response to the output signals of the differential pair 330. The slave latch 370 outputs the first output signal (Q) at a "high" logic level and the complementary second output signal (QB) at a "low" logic level, in response to the output voltage (Sb) at a "low" logic level and the output signal (Rb) at a "high" logic level.

If the first data (D) is a "low" logic level and the second data (DB) is a "high" logic level, the voltage of the node (NOD3) becomes lower than the voltage of the node (NOD2). Therefore, because the transistor 351 is turned off, the output voltage (Sb) of the node (NOD4) maintains a "high" logic level, but because the transistor 353 is turned on, the output voltage (Rb) of the node (NOD5) changes to a "low" logic level.

The slave latch 370 outputs the first output signal (Q) at a "low" logic level and the complementary second output signal (QB) at a "high" logic level, in response to the output voltage (Sb) at a "high" logic level, and the output signal (Rb) at a "low" logic level.

FIG. 6 is a table showing the simulation result of a SAFF and a RCSFF of the prior art technology, and RPLFF parameters according to an embodiment of the present invention. Referring to FIG. 6, the RPLFF according to the embodiment of the present invention consumes less power on average than the prior art SAFF or RCSFF. Also, the rise delay and fall delay of the RPLFF are much shorter than those of the RCSFF. Therefore, the RPLFF according to the embodiment of the present invention reduces the average power consumption and increases data sensing speed.

As described above, since the data output method and data output circuit disclosed herein can reduce the amplitude of the clock signal (the clock voltage) to less than the supply voltage, the clock power is reduced.

Also, since the data output method and data output circuit as disclosed herein no additional boosting power supply or additional apparatus providing boosting power, the chip size can be reduced.

In addition, the data output method and data output circuit as disclosed herein can reduce the precharge voltage to less than the supply voltage, and can increase the data sensing speed with the slave latch having a higher speed than the prior art R-S latch.

So far, embodiments have been explained in the drawings and specification, and though specific terminologies are used here, these were only to explain the invention. The circuits 310 through 370 of FIG. 3 and the circuits 410 through 480 of FIG. 4 are divided for convenience of explanation, and do not restrict or limit the elements of the present invention. Therefore, the present invention is not restricted to the above-described embodiments, and many variations are possible within the spirit and scope of the present invention. The scope of the present invention is not determined by the description but by the accompanying claims.

What is claimed is:

1. A data output method comprising:
   (a) precharging output terminals to a precharge voltage lower than a supply voltage in response to a clock signal having a first state; and
   (b) outputting differential output signals to the output terminals in response to differential input signals in response to the clock signal having a second state,
   wherein the clock signal has a voltage swing which is lower than the precharge voltage.

2. The method of claim 1, further comprising:
   latching the differential output signals.

3. A data output method comprising:
   (a) precharging output terminals to a first voltage lower than a supply voltage, in response to a clock signal having a first state; and
   (b) converting received first differential output signals into second differential output signals, in response to the clock signal having a second state, and outputting the converted signals to the output terminals,
   wherein the clock signal is provided at a second voltage lower than the first voltage.

4. A data output circuit adapted to output a differential output signal to output terminals, comprising:
   a precharge circuit adapted to precharge the output terminals to a precharge voltage lower than a supply voltage in response to a clock signal having a first state; and
   an output circuit adapted to output the differential output signals to the output terminals in response to differential input signals in response to the clock signal having a second state,
   wherein a voltage of the clock signal is lower than the precharge voltage.

5. The circuit of claim 4, further comprising:
   a latch circuit adapted to latch the differential output signals.

6. A data output circuit with a flip-flop having a master latch and a slave latch, wherein the master latch comprises:
   a precharge circuit adapted to precharge output terminals to a precharge voltage lower than a supply voltage in response to a clock signal having a first state; and
   an output circuit adapted to output differential output signals to the output terminals in response to differential input signals in response to the clock signal having a second state,
   wherein a voltage of the clock signal is lower than the precharge voltage.

7. The circuit of claim 6, wherein the precharge circuit comprises a precharge/equalizer circuit that, in response to a clock signal having a first state, precharges the output terminals to the precharge voltage and equalizes the output terminals; and the output circuit comprises a differential pair that, in response to the clock signal having a second state, receives differential input signals and outputs first output signals corresponding to the differential input signals, and a CMOS logic circuit that outputs the differential output signals in response to the first output signals.

* * * * *